United States Patent
Choy et al.

(10) Patent No.: US 6,800,333 B2
(45) Date of Patent: Oct. 5, 2004

(54) METHOD OF DEPOSITING IN SITU A SOLID FILM ON A SUBSTRATE

(75) Inventors: Kwang-Leong Choy, Birmingham (GB); Bo Su, Birimingham (GB)

(73) Assignee: Innovative Materials Processing Technologies Limited, London (GB)

(*) Notice: Subject to any disclaimer, the term of this patent is extended or adjusted under 35 U.S.C. 154(b) by 0 days.

(21) Appl. No.: 09/909,173

(22) Filed: Jul. 13, 2001

(65) Prior Publication Data

US 2002/0106452 A1 Aug. 8, 2002

Related U.S. Application Data

(63) Continuation-in-part of application No. PCT/GB00/00013, filed on Jan. 5, 2000.

(30) Foreign Application Priority Data

Jan. 15, 1999 (GB) .......................................... 9900955.7

(51) Int. Cl.⁷ .............................................. B05D 1/04
(52) U.S. Cl. ....................................... 427/475; 427/483
(58) Field of Search ............................... 427/475, 477, 427/483, 485, 486; 118/629, 634

(56) References Cited

U.S. PATENT DOCUMENTS

| | | | | |
|---|---|---|---|---|
| 3,436,257 A | * | 4/1969 | Myers | |
| 5,298,277 A | * | 3/1994 | Hirose | |
| 5,344,676 A | * | 9/1994 | Kim et al. | |

FOREIGN PATENT DOCUMENTS

| | | |
|---|---|---|
| EP | 0103505 A1 | 8/1983 |
| SU | 1319914 A1 | 6/1987 |
| SU | 1607967 A1 | 12/1988 |
| WO | WO 97/21848 | 6/1997 |
| WO | 97/21848 | * 6/1997 |
| WO | WO 98/09731 | 3/1998 |

OTHER PUBLICATIONS

Ryu, C.K. and Kim, K. "Fabrication of ZnO thing films using charged liquid cluster beam technique." Applied Physics Letters 1995, 67(22):3337–3339.

(List continued on next page.)

*Primary Examiner*—Fred J. Parker
(74) *Attorney, Agent, or Firm*—Frommer Lawrence & Haug, LLP; Thomas J. Kowalski; Angela M. Collison

(57) ABSTRACT

In preferred aspects the present invention provides: (i) a method of and apparatus for depositing material, preferably a film, on a substrate, the method comprising the steps of: providing a substrate; heating the substrate; generating an aerosol comprising droplets of a material solution; providing a nozzle unit for delivering the aerosol to the substrate, the nozzle unit including at least one outlet through which a directed flow of the aerosol is delivered and at least one electrode; charging the aerosol droplets with a positive or negative charge; providing a flow of the aerosol through the nozzle unit so as to deliver a directed flow of the aerosol from the at least one outlet; and generating an electric field between the substrate and the at least one electrode such that the directed aerosol flow is attracted towards the substrate; and (ii) a method of and apparatus for fabricating a powder, preferably an ultrafine powder, the method comprising the steps of: providing a heated zone; generating an aerosol comprising droplets of a material solution; providing a nozzle unit for delivering the aerosol to the heated zone, the nozzle unit including at least one outlet through which a directed flow of the aerosol is delivered and at least one electrode; charging the aerosol droplets with a positive or negative charge; providing a flow of the aerosol through the nozzle unit so as to deliver a directed flow of the aerosol from the at least one outlet; and generating an electric field between the heated zone and the at least one electrode such that the directed aerosol flow is attracted towards the heated zone where the aerosol droplets react homogeneously in the gas phase to form a powder.

40 Claims, 6 Drawing Sheets

OTHER PUBLICATIONS

Siefert, W. "Corona Spray Pyrolysis: A new coating technique with an extremely enhanced deposition efficiency." Thin Solid Films 1984, 12(275):267–274.

Siefert, W. "Properties of thin In2O3 and SnO2 films prepared by corona spray pyrolysis, and a discussion of the spray pyrolysis process.". Thin Solid Films 1984, 12(275):275–281.

* cited by examiner

METHOD OF DEPOSITING IN SITU A SOLID FILM ON A SUBSTRATE

CROSS-REFERENCE TO RELATED APPLICATIONS

This application is a Continuation-in-Part of PCT/GB00/00013, filed Jan. 5, 2000, designating the U.S., published Jul. 29, 2000 as WO-00/42234 and claiming priority from GB-9900955.7 filed Jan. 15, 1999. All of the above-mentioned applications, as well as all documents cited herein and documents referenced or cited in documents cited herein, are hereby incorporated herein by reference.

BACKGROUND OF THE INVENTION

The present invention relates to a method of and an apparatus for depositing material, preferably a film, on a substrate and to a method of and an apparatus for fabricating a powder, preferably an ultrafine powder.

Material films, in particular ceramic films, have wide ranging structural and functional applications. These different applications often require films of different thickness, but there is no single commercially cost-effective film or coating deposition technique for depositing both thin films, typically films having a thickness of less than 1 $\mu$m, and thick films, typically films having a thickness greater than 10 $\mu$m.

Vapour processing techniques, including chemical vapour deposition (CVD) and physical vapour deposition (PVD), have been used to fabricate thin films, but, because of the slow deposition rate and expensive equipment, are not suited to the deposition of thick films of large area. Moreover, the coating of substrates of complex shape is particularly difficult using a PVD technique.

Sol-gel processing techniques have also been used to deposit thin films, but, while thin films can be achieved in a single coating run, thicker films provided by a single coating are cracked and thus thick solid films have to be built up by performing a plurality of successive coating runs.

A novel deposition technique, referred to as electrostatic spray assisted vapour deposition (ESAVD) and disclosed in WO-A-97/21848, has also been used particularly to deposit thin films. In this ESAVD technique, an aerosol is electrostatically generated from a nozzle unit and a temperature gradient and electric field are provided between the substrate and the nozzle unit such that the aerosol droplets undergo combustion and/or chemical reaction in the vapour phase close to the surface of the substrate. This deposition technique is capable of producing solid films which exhibit excellent substrate adhesion, but does have limitations as a consequence of electrostatically generating the aerosol, for example, with regard to the nature of the utilisable precursor solutions, the deposition rate and the droplet size distribution of the aerosols.

Spray pyrolysis, where a film is deposited by delivering an aerosol generated by ultrasonic atomisation to a heated substrate, has been used to deposit both thin and thick films as disclosed, for example, in EP-A-0103505 and GB-A-1362803, but the deposition efficiency is usually very low because of the very high loss of the aerosol to the environment, which loss is unacceptable both for environmental reasons and cost reasons where the precursor materials can be expensive and the deposition rate is very low. Furthermore, the deposition of very thick films, typically films having a thickness of greater than 150 $\mu$m, by spray pyrolysis is difficult. In published articles entitled "Corona Spray Pyrolysis" Thin Solid Films, 121 (1984), pages 267 to 274 and "Properties of Thin $In_2O_3$ and $SnO_2$ Films Prepared by Corona Spray Pyrolysis and a Discussion of the Spray Pyrolysis Process" Thin Solid Films, 121 (1984), pages 275 to 282, the deposition of thin films of doped $In_2O_3$ and $SnO_2$ by corona spray pyrolysis with a claimed deposition efficiency of up to 80% has been discussed, but this deposition technique essentially requires the use of an organic precursor solution, the delivery of the aerosol vertically downwardly so as to utilise the gravitational effect on the aerosol droplets, and a specific electrode configuration comprising two electrodes each disposed at an angle of from 40 to 45° relative to the vertically downward flow path of the aerosol.

It is an aim of the present invention to provide an improved method of and apparatus for depositing material, preferably one of thin or thick films, on a substrate, referred to as electrostatic assisted aerosol jet deposition (EAAJD), which in particular is low cost and exhibits a high deposition efficiency, and an improved method of and apparatus for fabricating a powder, preferably an ultrafine powder.

BRIEF SUMMARY OF THE INVENTION

Accordingly, the present invention provides a method of depositing material, preferably a film, on a substrate, comprising the steps of: providing a substrate; heating the substrate; generating an aerosol comprising droplets of a material solution; providing a nozzle unit for delivering the aerosol to the substrate, the nozzle unit including at least one outlet through which a directed flow of the aerosol is delivered and at least one electrode; charging the aerosol droplets with a positive or negative charge; providing a flow of the aerosol through the nozzle unit so as to deliver a directed flow of the aerosol from the at least one outlet; and generating an electric field between the substrate and the at least one electrode such that the directed aerosol flow is attracted towards the substrate.

Preferably, the substrate is heated to a temperature of less than about 1050° C., more preferably less than about 800° C.

Preferably, the substrate is heated during deposition.

More preferably, the thermal environment is such as to maintain a decreasing temperature gradient in a direction away from the substrate towards the nozzle unit.

In one embodiment the material solution is an aqueous solution.

In another embodiment the material solution is a non-aqueous solution. Preferred non-aqueous solvents include acetylacetone, methanol and 2-methoxyethanol.

In one embodiment the aerosol droplets are at least partially charged prior to exiting the at least one outlet.

In another embodiment the aerosol droplets are charged prior to exiting the at least one outlet.

In a further embodiment the aerosol droplets are at least partially charged after exiting the at least one outlet.

Preferably, the aerosol droplets are charged by the at least one electrode.

Preferably, the at least one electrode is disposed at least partially in each aerosol flow.

Preferably, the at least one electrode extends upstream of the at least one outlet.

Preferably, the at least one electrode comprises an elongate element.

Preferably, the distal end of the at least one electrode is located at substantially the centre of the at least one outlet.

In one embodiment the distal end of the at least one electrode includes a single tip.

In another embodiment the distal end of the at least one electrode includes a plurality of tips.

Preferably, the nozzle unit includes a tubular section upstream of each outlet.

More preferably, the tubular section is an elongate section.

More preferably, the tubular section is a linear section.

More preferably, the tubular section is substantially cylindrical.

More preferably, the at least one electrode extends substantially entirely through the associated tubular section.

More preferably, the at least one electrode extends substantially along the central axis of the associated tubular section.

More preferably, at least the inner surface of the tubular section is composed of an insulating material.

In one embodiment the aerosol flow is provided by entraining the aerosol in a flow of a carrier gas fed to the nozzle unit.

In another embodiment the aerosol flow is provided by applying a reduced pressure to the at least one outlet so as to entrain the aerosol in a flow of a carrier gas drawn through the nozzle unit.

In one embodiment the carrier gas is a gas reactive to the material solution. In another embodiment the carrier gas is a gas non-reactive to the material solution.

Preferably, the flow of the carrier gas is provided, typically by controlling the flow rate, temperature and/or direction, such as to maintain the decreasing temperature gradient.

Preferably, the aerosol is delivered to the substrate such as to achieve a film growth rate of at least 0.2 $\mu$m per minute.

More preferably, the aerosol is delivered to the substrate such as to achieve a film growth rate of at least 1 $\mu$m per minute.

Still more preferably, the aerosol is delivered to the substrate such as to achieve a film growth rate of at least 2 $\mu$m per minute.

Preferably, the flow rate through the at least one outlet is at least 5 ml per minute, more preferably at least 50 ml per minute.

Preferably, the nozzle unit is configured such that the aerosol flow from the at least one outlet is directed upwards, more preferably substantially vertically upwards.

Preferably, the nozzle unit includes a perforated member upstream of the at least one outlet. In a preferred embodiment the perforated member comprises a mesh.

Preferably, the applied voltage is less than about 35 kV, more preferably less than about 20 kV.

Preferably, the distance between the at least one outlet and the substrate is less than about 100 mm, more preferably less than about 50 mm.

In one embodiment the substrate is held stationary relative to the nozzle unit.

In another embodiment the method further comprises the step of moving the nozzle unit relative to the substrate.

Preferably, the substrate is rotated, tilted and/or translated relative to the nozzle unit In one embodiment deposition is performed at atmospheric pressure.

In another embodiment deposition is performed below atmospheric pressure.

In a further embodiment deposition is performed above atmospheric pressure.

Preferably, the method further comprises the step of varying one or both of the composition and concentration of the material solution during deposition.

Preferably, the method further comprises the step of reversing the polarity between the substrate and the at least one electrode at intervals during deposition.

Preferably, the method further comprises the step of locally heating at least one area of the substrate.

Preferably, the method further comprises the step of one or both of electrically or magnetically steering the aerosol droplets in transit from the nozzle unit to the substrate.

Preferably, the film is one or both of a structural film or a functional film; typically, for use in engineering and medical applications.

Preferably, the film is one of a dense or porous film.

Preferably, the film is one of an amorphous or crystalline film.

Preferably, the film is one of a simple film, a doped film or a multi-component film; typically, non-oxide or oxide films.

Preferably, the film is a composite film.

Preferably, the film is a compositionally-graded film.

Preferably, the film is a multi-layered film.

In one embodiment the film is an inorganic film.

Preferably, the film is a ceramic film, more preferably an electroceramic film.

In another embodiment the film is an organic film.

Preferably, the film is a polymer film.

In a further embodiment the film is a hybrid film, such as an organic/inorganic film.

The present invention also provides an apparatus for depositing material, preferably a film, on a substrate, comprising: a substrate holder for holding a substrate; a heater for heating the substrate; an aerosol generator for generating an aerosol comprising droplets of a material solution; a charge applicator for applying a positive or negative charge to the aerosol droplets; a nozzle unit in communication with the aerosol generator for delivering the aerosol to the substrate, the nozzle unit including at least one outlet through which a directed flow of the aerosol is in use delivered and at least one electrode; and a high voltage supply for generating an electric field between the substrate and the at least one electrode such that the directed aerosol flow is in use attracted towards the substrate.

Preferably, the apparatus is configured to maintain a decreasing temperature gradient in a direction away from the substrate towards the nozzle unit.

Preferably, the at least one electrode extends upstream of the at least one outlet.

Preferably, the at least one electrode comprises an elongate element.

Preferably, the distal end of the at least one electrode is located at substantially the centre of the at least one outlet.

In one embodiment the distal end of the at least one electrode includes a single tip.

In another embodiment the distal end of the at least one electrode includes a plurality of tips.

Preferably, the nozzle unit includes a tubular section upstream of each outlet.

More preferably, the tubular section is an elongate section.

More preferably, the tubular section is a linear section.

More preferably, the tubular section is substantially cylindrical.

More preferably, the at least one electrode extends substantially entirely through the associated tubular section.

More preferably, the at least one electrode extends substantially along the central axis of the associated tubular section.

More preferably, at least the inner surface of the tubular section is composed of an insulating material.

Preferably, the apparatus further comprises a gas supply unit in communication with the aerosol generator for supplying a flow of a carrier gas for entraining the aerosol and delivering the same through the nozzle unit.

Preferably, the at least one outlet is directed upwards, more preferably substantially vertically upwards.

Preferably, the distance between the at least one outlet and the substrate is less than about 100 mm, more preferably less than about 50 mm.

In one embodiment the nozzle unit and the substrate holder are held in fixed relation.

In another embodiment the nozzle unit and the substrate holder are configured so as to be movable relative to one another.

More preferably, the substrate holder is rotatable, tiltable and/or translatable relative to the nozzle unit.

Preferably, the nozzle unit includes a perforated member upstream of the at least one outlet. In one embodiment the perforated member comprises a mesh.

The present invention further provides a method of fabricating a powder, preferably an ultrafine powder, comprising the steps of: providing a heated zone; generating an aerosol comprising droplets of a material solution; providing a nozzle unit for delivering the aerosol to the heated zone, the nozzle unit including at least one outlet through which a directed flow of the aerosol is delivered and at least one electrode; charging the aerosol droplets with a positive or negative charge; providing a flow of the aerosol through the nozzle unit so as to deliver a directed flow of the aerosol from the at least one outlet; and generating an electric field between the heated zone and the at least one electrode such that the directed aerosol flow is attracted towards the heated zone where the aerosol droplets react homogeneously in the gas phase to form a powder.

The present invention still further provides an apparatus for fabricating a powder, preferably an ultrafine powder, comprising: a heater for providing a heated zone; an aerosol generator for generating an aerosol comprising droplets of a material solution; a charge applicator for applying a positive or negative charge to the aerosol droplets; a nozzle unit in communication with the aerosol generator for delivering the aerosol to the heated zone, the nozzle unit including at least one outlet through which a directed flow of the aerosol is in use delivered and at least one electrode; and a high voltage supply for generating an electric field between the heated zone and the at least one electrode such that the directed aerosol flow is in use attracted towards the heated zone where the aerosol droplets react homogeneously in the gas phase to form a powder.

The present invention is able, unlike the ESAVD technique disclosed in WO-A-97/21848, to utilise both aqueous and non-aqueous precursor solutions and particularly colloidal sol solutions, and allows much higher deposition rates, typically at least twice the rate possible using the ESAVD technique. Further, unlike the deposition technique disclosed in EP-A-0103505, crystalline, in particular dense, films can be produced in a single run without requiring a post-deposition heat treatment. Still further, unlike the corona spray pyrolysis deposition technique mentioned hereinabove, an organic precursor solution is not essentially required and in delivering the aerosol upwardly, preferably substantially vertically upwardly, to a downwardly-facing substrate, a more stable thermal environment can be maintained at the surface of the substrate so as to allow for a more precise control of the film deposition and hence provide an improved film.

In preferred embodiments of the present invention a deposition efficiency of at least 90% has been obtained, which enhanced deposition efficiency reduces the product cost and minimises the loss of the possibly harmful precursor materials to the environment.

BRIEF DESCRIPTION OF THE DRAWINGS

Preferred embodiments of the present invention will now be described hereinbelow by way of example only with reference to the accompanying drawings, in which.

DETAILED DESCRIPTION OF THE PREFERRED EMBODIMENTS

Figure 1:
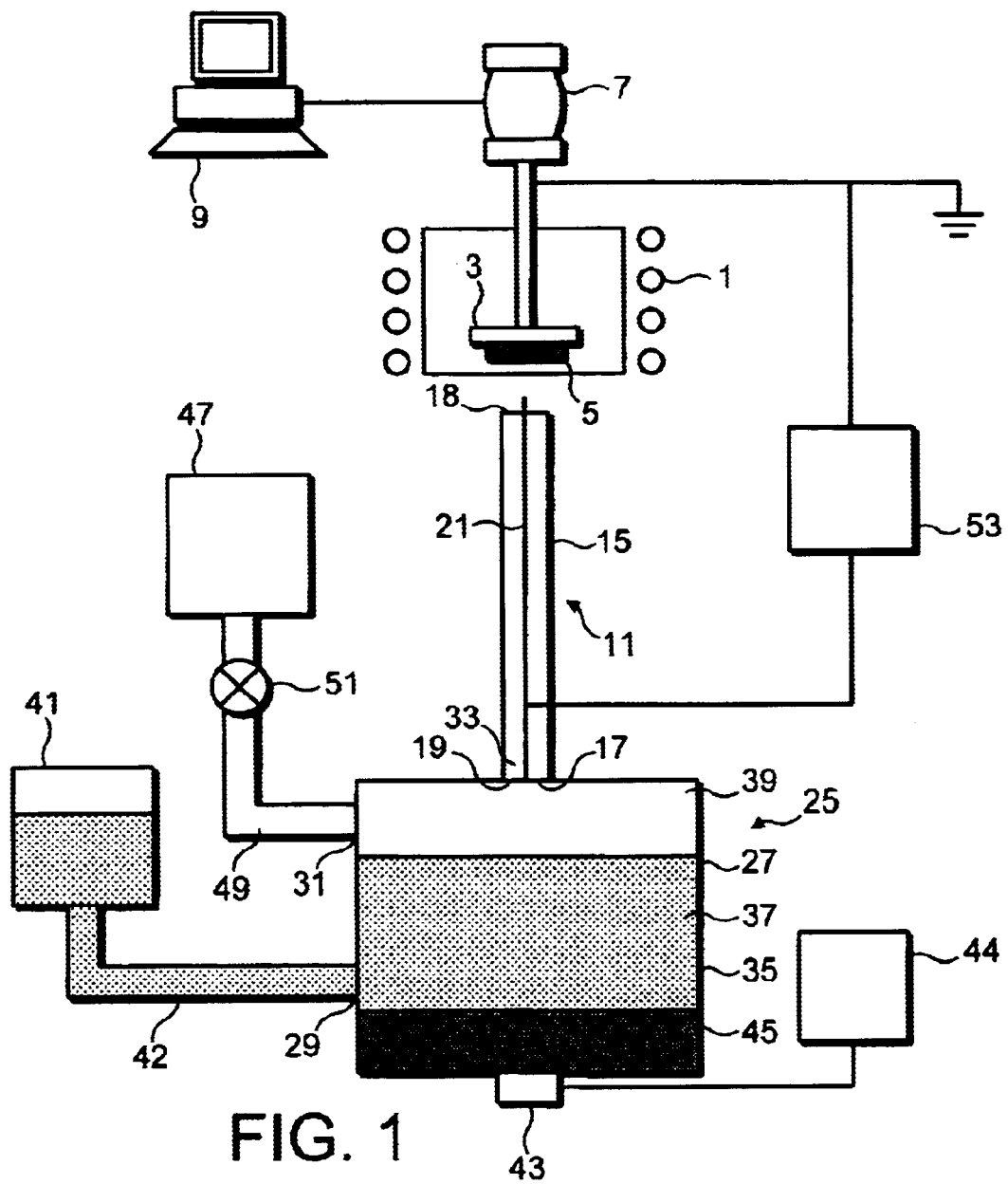
FIG. 1 schematically illustrates a film deposition apparatus in accordance with a first embodiment of the present invention.

FIG. 1 illustrates a film deposition apparatus in accordance with a first embodiment of the present invention.

The film deposition apparatus comprises a heater 1, in this embodiment a tube furnace, for providing a heated zone, and a substrate holder 3 for holding a substrate 5 in the heated zone such as to provide a decreasing temperature gradient in a direction away from the surface of the substrate 5 to be coated. The substrate holder 3 is movably disposed relative to the heater 1 such as to be able to alter both the temperature and the temperature gradient at the surface of the substrate 5 to be coated. In this embodiment the substrate holder 3 is also rotatably disposed about the longitudinal axis of the heater 1 such as to present a moving surface of the substrate 5 to be coated to one end of the heater 1 and thereby enable more uniform film deposition.

The film deposition apparatus further comprises a motor unit 7 which is coupled to the substrate holder 3 such as on operation to rotate the same, and a computer 9 for controlling the operation of the motor unit 7.

Figure 2:
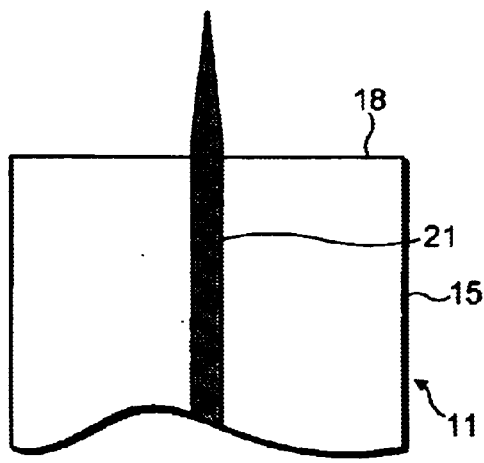
FIG. 2 illustrates a sectional view of the outlet end of the nozzle unit of the film deposition apparatus of FIG. 1.
Figure 3:
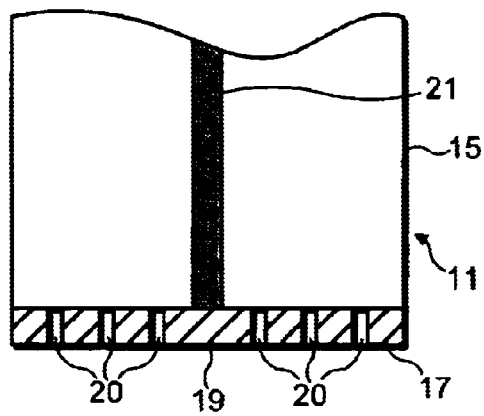
FIG. 3 illustrates a sectional view of the inlet end of the nozzle unit of the film deposition apparatus of FIG. 1.
Figure 4:
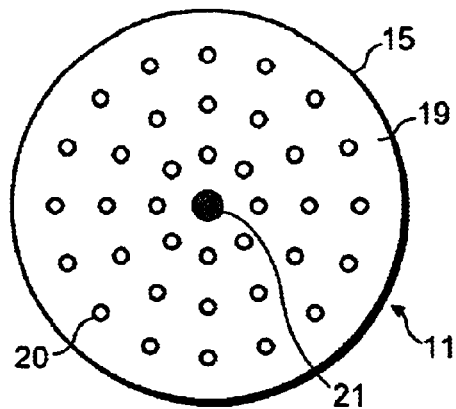
FIG. 4 illustrates an end view of the inlet end of the nozzle unit of the film deposition apparatus of FIG. 1.
Figure 5:
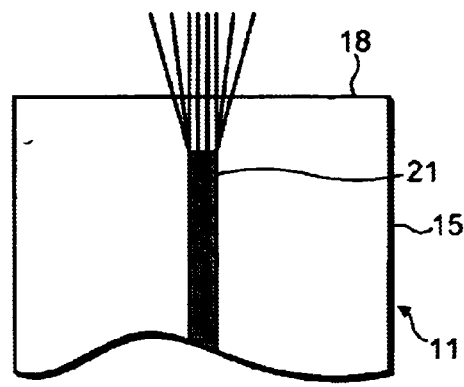
FIG. 5 illustrates a sectional view of the outlet end of a modified nozzle unit for the film deposition apparatus of FIG. 1.
Figure 6:
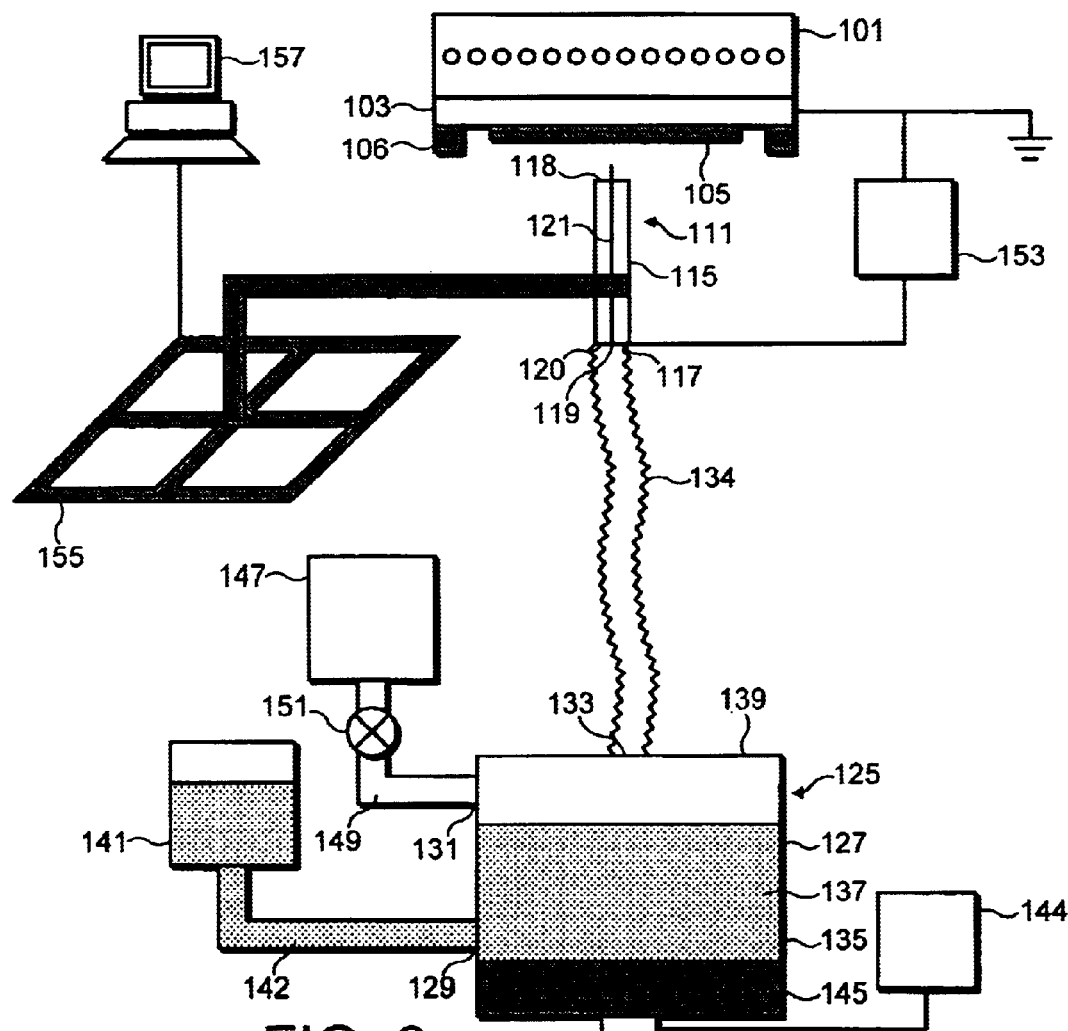
FIG. 6 schematically illustrates a film deposition apparatus in accordance with a second embodiment of the present invention.
Figure 7:
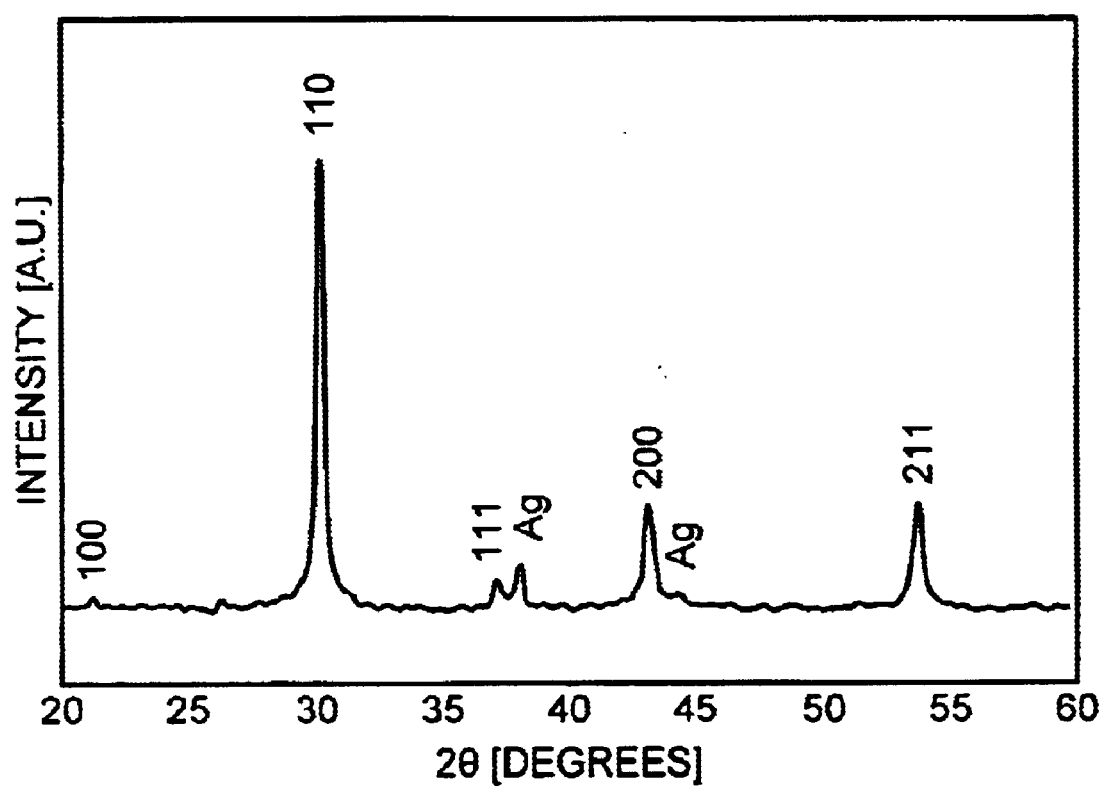
FIG. 7 illustrates an X-ray diffraction pattern of a $BaZrO_3$ film as fabricated by Example 1.
Figure 8A:
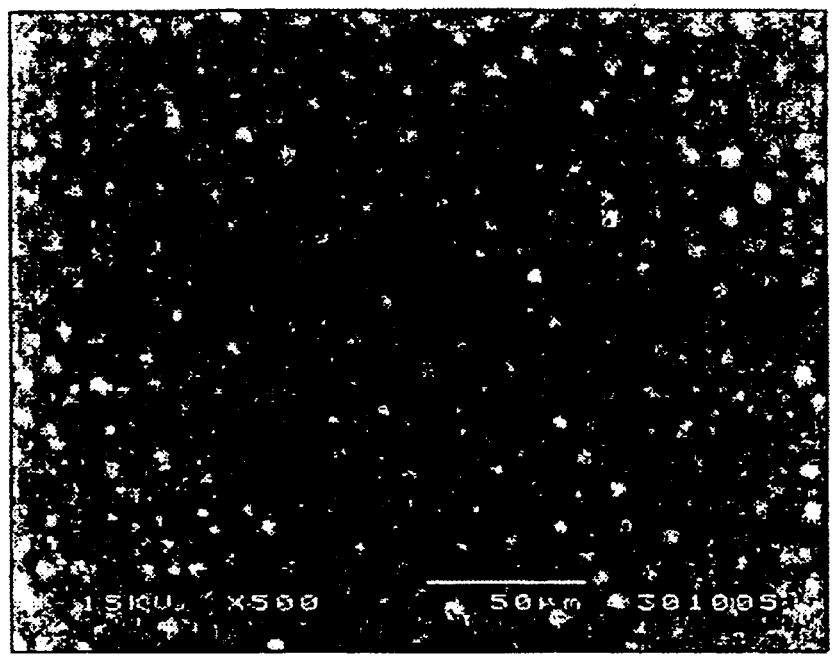
FIGS. 8(a) and (b) illustrate surface and cross-sectional SEM micrographs of a CdS film as fabricated by Example 2.
Figure 8B:
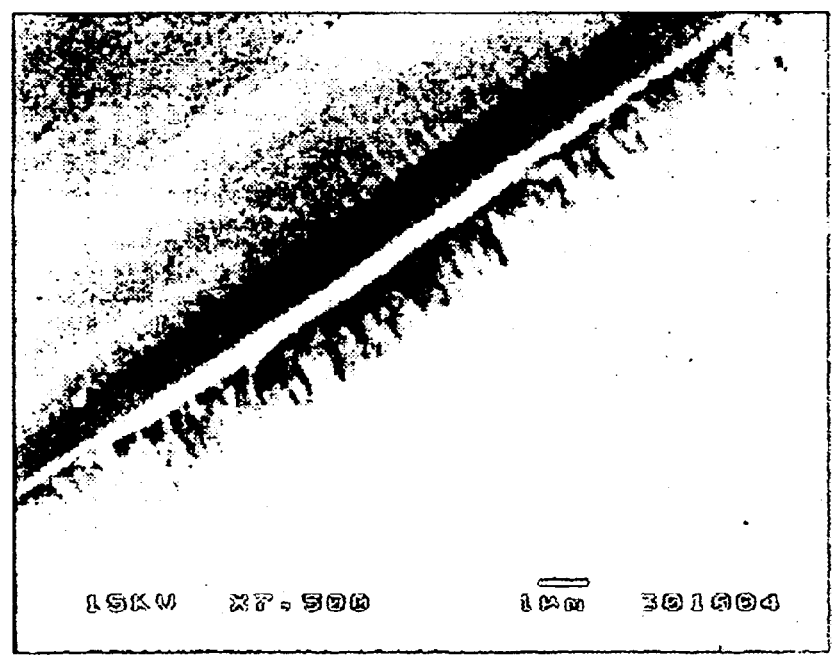
Figure 9A:
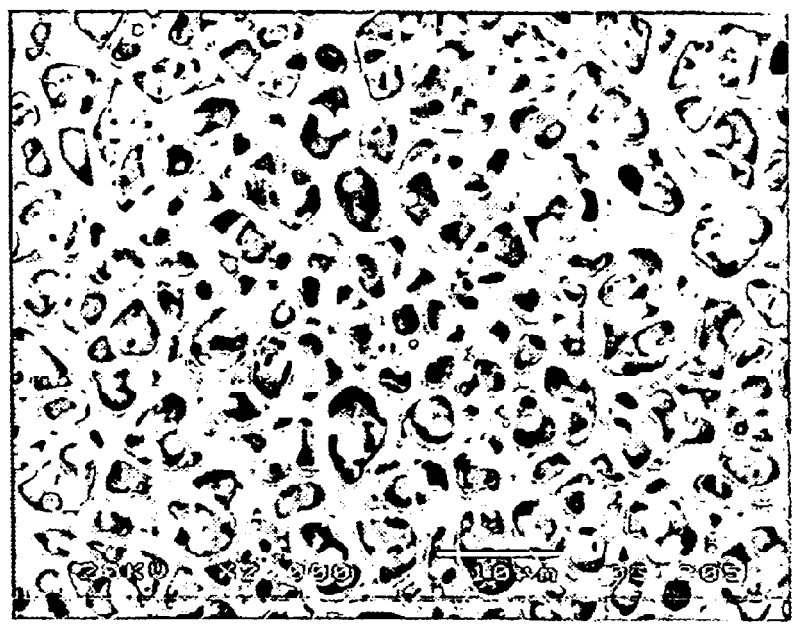
FIGS. 9(a) and (b) illustrate surface and cross-sectional SEM micrographs of a porous $SiO_2$ film as fabricated by Example 3.
Figure 9B:
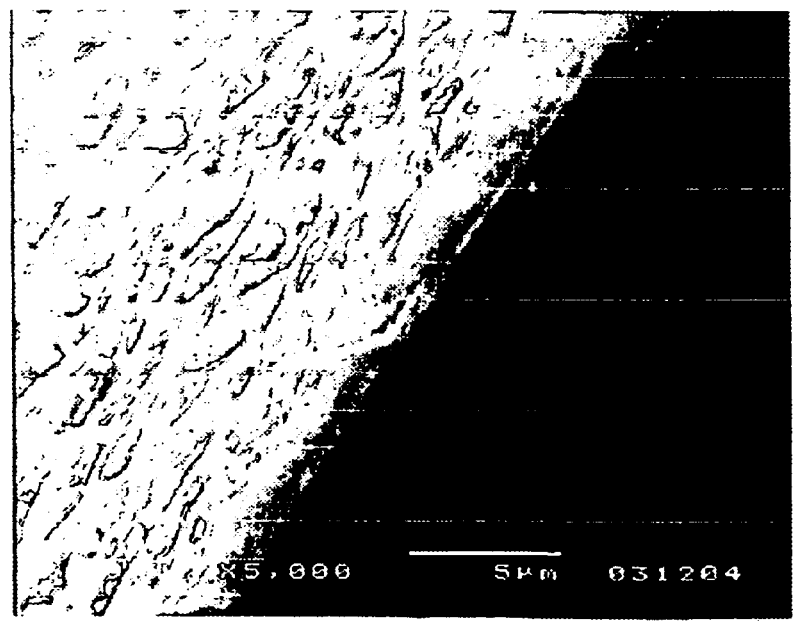

Referring particularly to FIGS. 2 to 4, the film deposition apparatus further comprises a nozzle unit 11 for delivering a directed aerosol flow to the substrate 5 to be coated. The nozzle unit 11 comprises a tubular section 15, in this embodiment an elongate cylindrical section, which includes an inlet port 17 at one end thereof through which an aerosol flow is introduced and an outlet port 18 at the other end thereof through which a directed aerosol flow is delivered to the substrate 5 to be coated, the internal geometry of the tubular section 15 being such as to confer directionality to the aerosol flow. The distance between the outlet port 18 of the nozzle unit 11 and the substrate 5 is preferably less than 100 mm, more preferably less than 50 mm, and still more preferably not more than 20 mm. The tubular section 15 is formed of a non-conductive, insulating material, such as a ceramic, glass or quartz, which can withstand the high temperatures developed by the heater 1. The nozzle unit 11 further comprises a perforated member 19 disposed at the inlet port 17 of the tubular section 15, with the flow path through the tubular section 15 being through the perforations 20 in the perforated member 19. The perforated member 19 is a conductive member, preferably formed of aluminum, stainless steel or an indium-tin oxide coated plate. The nozzle unit 11 further comprises an electrode 21, in this embodiment an elongate element, such as a wire, having a single sharp-pointed tip, which is attached to the perforated member 19 and extends co-axially through the length of the tubular section 15, in this embodiment with the tip thereof located downstream of the outlet port 18. The electrode 21 can be formed of any conductive material, but is preferably formed of aluminum, stainless steel or tungsten. In a modified nozzle unit 11, as illustrated in FIG. 5, the electrode 21 can be multi-tipped.

The film deposition apparatus further comprises an aerosol generator 25 for providing a flow of an aerosol to the inlet port 17 of the nozzle unit 11. The aerosol generator 25 comprises a chamber 27 which includes first and second inlet ports 29, 31 and an outlet port 33 connected to the inlet port 17 of the nozzle unit 11, and defines a reservoir 35 for containing a precursor solution 37 to be aerosolised and a head space 39 in which an aerosol collects when generated. The aerosol generator 25 further comprises a liquid level controller 41 connected by a line 42 to the first inlet port 29 of the chamber 27 for maintaining a constant volume of the precursor solution 37 in the reservoir 35. The aerosol generator 25 further comprises a piezoelectric transducer 43 which is driven by a power supply 44 and is in communication with the reservoir 35 through a transfer medium 45, such as water, contained separately from the precursor solution 37 such that on operation of the piezoelectric transducer 43 the liquid precursor 37 is ultrasonically vibrated to generate an aerosol in the head space 39. In a preferred embodiment the piezoelectric transducer 43 is operated at a frequency in the range of from 1.7 to 3 MHz, thereby allowing aerosols to be achieved at a rate of greater than 5 ml per minute with a droplet size of less than 2 $\mu$m and a narrow size distribution. The aerosol generator 25 further comprises a gas supply unit 47 connected through a delivery line 49 to the second inlet port 31 of the chamber 27 for providing a flow of a carrier gas through the chamber 27 such as to entrain the aerosol in the head space 39 and transport the same to the substrate 5 through the nozzle unit 11. In this embodiment the delivery line 49 includes a flow regulating valve 51 for controlling the flow rate of aerosol to the substrate 5. Preferably, the carrier gas comprises at least one of air, Ar, $H_2S$, $N_2$, $NH_3$ and $O_2$. In an alternative embodiment, instead of or in addition to the gas supply unit 47, pressure reducing means, such as a vacuum pump, could be provided for applying a reduced pressure at the outlet port 18 of the tubular section 15 so as to draw the aerosol as a flow therethrough.

The film deposition apparatus further comprises a high voltage d.c. supply 53 connected between the electrode 21 and the substrate 5 such as to establish an electric field between the same, which electric field charges the aerosol droplets on passing the electrode 21 and causes the charged droplets to be attracted to the substrate 5 on exiting the outlet port 18 of the nozzle unit 11. In a preferred embodiment the voltage applied between the electrode 21 and the substrate 5 is from 10 to 30 kV.

In use, the aerosol generator 25 is operated to provide a gas flow entraining aerosol droplets through the nozzle unit 11, which flow through the nozzle unit 11 provides a directed aerosol flow from the outlet port 18 of the tubular section 15 and results in charging of the aerosol droplets on passing the electrode 21. On exiting the outlet port 18 of the nozzle unit 11 the charged aerosol droplets are attracted to the substrate 5, with the flow rate of the aerosol, and the temperature and temperature gradient at the surface of the substrate 5 being optimised to achieve the desired film properties, typically one of a porous or dense solid film. In preferred embodiments the thermal environment and the velocity of the directed aerosol flow can be configured such that the aerosol droplets are vaporized/decomposed close to the surface of the substrate 5 or impact the surface of the substrate 5 prior to vaporization/decomposition. This process is continued until a film of the required thickness has been achieved on the substrate 5.

FIG. 6 illustrates a film deposition apparatus in accordance with a second embodiment of the present invention which finds particular application in the deposition of films on large area substrates.

The film deposition apparatus comprises a heater 101, in this embodiment a resistance heater, and a substrate holder 103 for holding a substrate 105 mounted to the heater 101 such as to provide a decreasing temperature gradient in a direction away from the surface of the substrate 5 to be coated. In this embodiment the substrate holder 103 includes an insulating member 106 which extends forwardly about the periphery of the substrate 105 and is configured to maintain a uniform temperature and temperature gradient at the surface of the substrate 105 to be coated. Although in this embodiment the substrate 105 is heated by contact heating, here resistance heating, non-contact heating, such as by way of an infra-red lamp, could be employed to heat the substrate 105.

The film deposition apparatus further comprises a nozzle unit 111 for delivering a directed aerosol flow to the substrate 105 to be coated. The nozzle unit 111 is of the same kind as employed in the film deposition apparatus of the above-described first embodiment, with corresponding reference signs being used to designate like parts.

The nozzle unit 111 comprises a tubular section 115, in this embodiment an elongate cylindrical section, which includes an inlet port 117 at one end thereof through which an aerosol flow is introduced and an outlet port 118 at the other end thereof through which a directed aerosol flow is delivered to the substrate 105 to be coated, the internal geometry of the tubular section 115 being such as to confer directionality to the aerosol flow. The distance between the outlet port 118 of the nozzle unit 111 and the substrate 105 is preferably less than 100 mm, more preferably less than 50 mm, and still more preferably not more than 20 mm. The tubular section 115 is formed of a non-conductive, insulating material, such as a ceramic, glass or quartz, which can withstand the high temperatures developed by the heater 101. The nozzle unit 111 further comprises a perforated member 119 disposed at the inlet port 117 of the tubular section 115, with the flow path through the tubular section 115 being through the perforations 120 in the perforated member 119. The perforated member 119 is a conductive member, preferably formed of aluminum, stainless steel, tungsten or an indium-tin oxide coated plate. The nozzle unit 111 further comprises an electrode 121, in this embodiment an elongate element, such as a wire, having a single sharp-pointed tip, which is attached to the perforated member 119 and extends co-axially through the length of the tubular section 115, in this embodiment with the tip thereof located downstream of the outlet port 118. The electrode 121 can be formed of any conductive material, but is preferably formed of aluminum, stainless steel or tungsten. In a modified nozzle unit 111, as illustrated in FIG. 5, the electrode 121 can be multi-tipped.

The film deposition apparatus further comprises an aerosol generator 125 for providing a flow of an aerosol to the inlet port 117 of the nozzle unit 111. The aerosol generator 125 comprises a chamber 127 which includes first and second inlet ports 129, 131 and an outlet port 133 connected by a flexible tubular section 134 to the inlet port 117 of the nozzle unit 111, and defines a reservoir 135 for containing a precursor solution 137 to be aerosolised and a head space 139 in which an aerosol collects when generated. The aerosol generator 125 further comprises a liquid level controller 141 connected by a line 142 to the first inlet port 129 of the chamber 127 for maintaining a constant volume of the precursor solution 137 in the reservoir 135. The aerosol generator 125 further comprises a piezoelectric transducer 143 which is driven by a power supply 144 and is in communication with the reservoir 135 through a transfer medium 145, such as water, contained separately from the precursor solution 137 such that on operation of the piezoelectric transducer 143 the precursor solution 137 is ultrasonically vibrated to generate an aerosol in the head space 139. The aerosol generator 125 further comprises a gas supply unit 147 connected through a delivery line 149 to the second inlet port 131 of the chamber 127 for providing a flow of a carrier gas through the chamber 127 such as to entrain the aerosol in the head space 139 and transport the same to the substrate 105 through the nozzle unit 111. In this embodiment the delivery line 149 includes a flow regulating valve 151 for controlling the flow rate of aerosol delivered to the substrate 105. Preferably, the carrier gas comprises at least one of air, Ar, $H_2S$, $N_2$, $NH_3$ and $O_2$. In an alternative embodiment, instead of or in addition to the gas supply unit 147, pressure reducing means, such as a vacuum pump, could be provided for applying a reduced pressure at the outlet port 118 of the tubular section 115 so as to draw the aerosol as a flow therethrough.

The film deposition apparatus further comprises a high voltage d.c. supply 153 connected between the electrode 121 and the substrate 105 such as to establish an electric field between the same, which electric field charges the aerosol droplets on passing the electrode 121 and causes the charged droplets to be attracted to the substrate 105 on exiting the outlet port 118 of the nozzle unit 111. In a preferred embodiment the voltage applied between the electrode 121 and the substrate 105 is from 10 to 30 kV.

The film deposition apparatus further comprises an X-Y-Z table 155 connected to the nozzle unit 111 so as to allow for movement of the nozzle unit 111 relative to the substrate 105 in coating substrates of large area and non-planar shape, and a computer 157 for controlling the X-Y-Z table 155. Where the substrate 105 is planar, the X-Y-Z table 155 could be replaced by an X-Y table.

In use, the aerosol generator 125 is operated to provide a gas flow entraining aerosol droplets through the nozzle unit 111, which flow through the nozzle unit 111 provides a directed aerosol flow from the outlet port 118 of the tubular section 115 and results in charging of the aerosol droplets on passing the electrode 121. On exiting the outlet port 118 of the nozzle unit 111 the charged aerosol droplets are attracted to the substrate 105, with the flow rate of the aerosol, and the temperature and temperature gradient at the surface of the substrate 105 being optimised to achieve the desired film properties, typically one of a porous or dense solid film. In preferred embodiments the thermal environment and the velocity of the directed aerosol flow can be configured such that the aerosol droplets are vaporized/decomposed close to the surface of the substrate 105 or impact the surface of the substrate 105 prior to vaporization/decomposition. This process is continued until a film of the required thickness has been achieved on the substrate 105.

The present invention will now be further described with reference to the following non-limiting Examples.

EXAMPLE 1

A non-aqueous precursor solution for the deposition of a $BaZrO_3$ film was first prepared as follows. Barium metal (as supplied by Aldrich) was completely dissolved in a volume of 2-methoxyethanol (as supplied by Aldrich) by stirring at room temperature to form a barium alkoxide solution. A stoichiometric amount of zirconium n-propoxide, a 70 wt % solution in n-propanol (as supplied by Aldrich), was then added to the barium methoxyoxide solution and refluxed at 124° C., the boiling point of 2-methoxyethanol, for five hours. Then, a volume of 2-methoxyethanol was added to the refluxed solution to provide a 0.05 M precursor solution. Using the apparatus of the first-described embodiment and the so-prepared solution, a $BaZrO_3$ film was deposited on a silver substrate 5, with a substrate temperature of 600° C., a substrate 5 to nozzle unit 11 distance of 30 mm, an electric field voltage of 10 kV, the piezoelectric transducer 43 of the aerosol generator 25 being operated at a frequency of 1.7 MHz and power of 50 W, and nitrogen being supplied at 30 ml per minute as the carrier gas. Nitrogen was used as the carrier gas to minimize the reaction between the barium and carbon dioxide in the air. The resulting film, formed in a single run without the need for any post-deposition heat treatment, was a crystalline $BaZrO_3$ film as characterized by the X-ray diffraction pattern illustrated in FIG. 7.

EXAMPLE 2

A 0.01 M aqueous precursor solution for the deposition of a CdS film was first prepared using cadmium chloride and thiourea. Using the apparatus of the second-described embodiment and the so-prepared solution, a CdS film was deposited on a glass substrate 105, with a substrate temperature of 450° C., a substrate 105 to nozzle unit 111 distance of 20 mm, an electric field voltage of 10 kV, the piezoelectric transducer 143 of the aerosol generator 125 being operated at a frequency of 1.7 MHz and power of 50 W, a deposition time of five minutes, and air being supplied at 50 ml per minute as the carrier gas. The resulting film, formed in a single run without the need for any post-deposition heat treatment, was a dense, crystalline CdS film having a thickness of about 1 μm, with a columnar structure and a smooth and uniform surface. SEM micrographs of the resulting film are illustrated in FIGS. 8(*a*) and (*b*).

EXAMPLE 3

A colloidal silica solution (LUDOX™, aqueous colloidal silica sols, as supplied by DuPont) was diluted with distilled water to prepare an aqueous precursor solution having a concentration of 0.1 g/ml for the deposition of a $SiO_2$ film. Using the apparatus of the second-described embodiment and the so-prepared solution, a $SiO_2$ film was deposited on a glass substrate 105 with a substrate temperature of 200° C., a substrate 105 to nozzle unit 111 distance of 20 mm, an electric field voltage of 10 kV, the piezoelectric transducer 143 of the aerosol generator 125 being operated at a frequency of 1.7 MHz and power of 20 W, a deposition time of one minute, and air being supplied at 50 ml per minute as the carrier gas. The resulting film, formed in a single run without the need for any post-deposition heat treatment, was a porous $SiO_2$ film with a reticular structure. SEM micrographs of the resulting film are illustrated in FIGS. 9(*a*) and (*b*).

Finally, it will be understood that the present invention has been described in its preferred embodiments and can be modified in many different ways within the scope of the invention as defined by the appended claims. For example, in coating substrates 5, 105 of large area or complex geometric shape, the nozzle units 11, 111 could be modified to include a plurality of outlet ports 18, 118 or the film deposition apparatus could be modified to include a plurality of nozzle units 11, 111.

What is claimed is:

1. A method of depositing in situ a solid film on a substrate, comprising the steps of:

providing a substrate;

heating the substrate such as to provide for deposition of a solid film;

providing a nozzle unit for delivering an aerosol to the substrate, the nozzle unit including at least one outlet through which a directed flow of the aerosol is delivered and at least one electrode;

generating an aerosol comprising droplets of a material solution upstream of the nozzle unit;

providing a flow of the aerosol through the nozzle unit so as to deliver a directed flow of the aerosol from the at least one outlet; and generating an electric field between the substrate and the at least one electrode such that the aerosol droplets are charged with a positive or negative charge and the directed aerosol flow is attracted towards the substrate.

2. The method of claim 1, wherein the substrate is heated to a temperature of less than about 1050° C., preferably less than about 800° C.

3. The method of claim 1, wherein the substrate is heated during the aerosol flow providing step.

4. The method of claim 3, wherein a decreasing temperature gradient is maintained in a direction away from the substrate towards the nozzle unit.

5. The method of claim 1, wherein the material solution is an aqueous solution.

6. The method of claim 1, wherein the material solution is a non-aqueous solution.

7. The method of claim 1, wherein the aerosol droplets are at least partially charged prior to exiting the at least one outlet.

8. The method of claim 7, wherein the aerosol droplets are charged prior to exiting the at least one outlet.

9. The method of claim 1, wherein the aerosol droplets are at least partially charged after exiting the at least one outlet.

10. The method of claim 1, wherein the aerosol droplets are charged by the at least one electrode.

11. The method of claim 1, wherein the at least one electrode is disposed at least partially in each aerosol flow.

12. The method of claim 1, wherein the at least one electrode extends upstream of the at least one outlet.

13. The method of claim 1, wherein the at least one electrode comprises an elongate element.

14. The method of claim 1, wherein the distal end of the at least one electrode is located at substantially the centre of the at least one outlet.

15. The method of claim 1, wherein the distal end of the at least one electrode includes a single tip.

16. The method of claim 1, wherein the distal end of the at least one electrode includes a plurality of tips.

17. The method of claim 1, wherein the nozzle unit includes a tubular section upstream of each outlet.

18. The method of claim 17, wherein the tubular section is an elongate section.

19. The method of claim 17, wherein the tubular section is a linear section.

20. The method of claim 17, wherein the tubular section is substantially cylindrical.

21. The method of claim 17, wherein the at least one electrode extends substantially entirely through the associated tubular section.

22. The method of claim 17, wherein the at least one electrode extends substantially along the central axis of the associated tubular section.

23. The method of claim 17, wherein at least the inner surface of the tubular section is composed of an insulating material.

24. The method of claim 1, wherein the aerosol flow is provided by entraining the aerosol in a flow of a carrier gas fed to the nozzle unit.

25. The method of claim 1, wherein the aerosol flow is provided by applying a reduced pressure to the at least one outlet so as to entrain the aerosol in a flow of a carrier gas drawn through the nozzle unit.

26. The method of claim 24, wherein the carrier gas is a gas reactive to the material solution.

27. The method of claim 24, wherein the carrier gas is a gas non-reactive to the material solution.

28. The method of claim 24, wherein the substrate is heated during the aerosol flow providing step and the flow of the carrier gas is provided such as to maintain a decreasing temperature gradient in a direction away from the substrate towards the nozzle unit.

29. The method of claim 1, wherein the aerosol is delivered to the substrate such as to achieve a film growth rate of at least 0.2 μm per minute, preferably at least 1 μm per minute, more preferably at least 2 μm per minute.

30. The method of claim 1, wherein the flow rate through the at least one outlet is at least 5 ml per minute, preferably at least 50 ml per minute.

31. The method of claim 1, wherein the nozzle unit is configured such that the directed aerosol flow from the at least one outlet is directed upwards, preferably substantially vertically upwards.

32. The method of claim 1, wherein the nozzle unit includes a perforated member upstream of the at least one outlet.

33. The method of claim 1, wherein the applied voltage is less than about 35 kV, preferably less than about 20 kV.

34. The method of claim 1, wherein the distance between the at least one outlet and the substrate is less than about 100 mm, preferably less than about 50 mm.

35. The method of claim 1, wherein the substrate is held stationary relative to the nozzle unit.

36. The method of claim 1, further comprising the step of moving the nozzle unit relative to the substrate.

37. The method of claim 36, wherein the substrate is rotated, tilted and/or translated relative to the nozzle unit.

38. The method of claim 1, when performed at atmospheric pressure.

39. The method of claim 1, when performed below atmospheric pressure.

40. The method of claim 1, when performed above atmospheric pressure.

* * * * *